United States Patent [19]

Boland

[11] Patent Number: 4,609,413
[45] Date of Patent: Sep. 2, 1986

[54] METHOD FOR MANUFACTURING AND EPITAXIALLY ISOLATED SEMICONDUCTOR UTILIZING ETCH AND REFILL TECHNIQUE

[75] Inventor: Bernard W. Boland, Scottsdale, Ariz.

[73] Assignee: Motorola, Inc., Schaumburg, Ill.

[21] Appl. No.: 553,326

[22] Filed: Nov. 18, 1983

[51] Int. Cl.[4] .................... H01L 21/205; H01L 21/76
[52] U.S. Cl. ..................................... 148/175; 29/571;
 29/576 E; 29/576 W; 29/577 C; 29/578;
 29/580; 148/DIG. 26; 148/DIG. 50; 148/DIG.
 85; 156/612; 156/649; 156/657; 156/662;
 357/48
[58] Field of Search ............... 29/571, 576 E, 576 W,
 29/577 C, 578, 580; 148/175, DIG. 26, DIG.
 50, DIG. 85; 156/612, 649, 653, 657, 662;
 357/48

[56] References Cited

U.S. PATENT DOCUMENTS

| | | | |
|---|---|---|---|
| 3,370,995 | 2/1968 | Lowery et al. | 148/175 |
| 3,456,169 | 7/1969 | Klein | 29/571 |
| 3,509,433 | 4/1970 | Schroeder | 317/234 |
| 3,566,220 | 2/1971 | Post | 148/175 X |
| 3,587,166 | 6/1971 | Alexander et al. | 148/175 X |
| 3,624,463 | 11/1971 | Davidshon | 317/234 |
| 3,740,276 | 6/1973 | Bean | 29/580 X |
| 3,753,803 | 8/1973 | Nomura et al. | 148/175 |
| 3,764,409 | 10/1973 | Nomura et al. | 29/580 X |
| 3,793,712 | 2/1974 | Bean et al. | 148/175 X |
| 3,853,644 | 12/1974 | Tarui et al. | 148/DIG. 50 |
| 4,089,021 | 5/1978 | Sato et al. | 148/DIG. 50 |
| 4,393,573 | 7/1983 | Kato et al. | 29/571 |
| 4,393,574 | 7/1983 | Shimbo | 29/571 |
| 4,394,196 | 7/1983 | Iwai | 148/187 |

FOREIGN PATENT DOCUMENTS 1144850  3/1969  United Kingdom ....... 148/DIG. 50

OTHER PUBLICATIONS

Chao et al., "Heavy Doping Isolation for CMOS Integrated Circuits", I.B.M. Tech. Discl. Bull., vol. 25, No. 7A, Dec. 1982, pp. 3350–3352.
Doo, V. Y., "High Capacitance PN Junction Capacitors by Etch-Refill Method", I.B.M. Tech. Discl. Bull., vol. 9, No. 7, Dec. 1966, pp. 920–921.
Doo, V. Y., "Junction Isolation—By an Etch and Regrowth Technique", I.B.M. Tech. Discl. Bull., vol. 8, No. 4, Sep. 1965, pp. 668–669.

Primary Examiner—William G. Saba
Attorney, Agent, or Firm—Robert M. Handy; Joe E. Barbee

[57] ABSTRACT

An improved means and method is provided for forming isolated device regions suitable for the construction of control circuits and devices, in the presence of and isolated from other device regions suitable for the construction of bottom-contact power devices. In a preferred embodiment the desired structure is obtained by growing a first epitaxial layer on a semiconductor substrate, providing a patterned mask in which areas of the epitaxial layer are exposed to be etched, etching recesses in the exposed areas to a first depth to leave pedestals beneath the masked areas, and forming a second and third epitaxial layer on the substrate to fill the recesses. The second epitaxial layer is U-shaped and conformally coats the bottom and sides of the recesses. The U-shaped layer acts as the isolation layer separating the first epitaxial layer portions in the pedestals wherein the power devices will be built, from the third epitaxial layer regions which fill in the U, where the control devices will be built. The doping of the power device region, isolation layer, and control circuitry region may be optimized separately.

7 Claims. 13 Drawing Figures

METHOD FOR MANUFACTURING AND EPITAXIALLY ISOLATED SEMICONDUCTOR UTILIZING ETCH AND REFILL TECHNIQUE

BACKGROUND OF THE INVENTION

1. Field of the Invention

This invention relates in general, to improved means and methods for semiconductor devices and, more particularly, to improved means and methods for isolated semiconductor device regions surrounding or adjacent to bottom-contact semiconductor device regions.

2. Background Art

In the design and manufacture of semiconductor structures, particularly those containing both integrated control circuits and power devices, it is frequently desired to isolate different device regions placed within the same semiconductor body. The need for such isolation is especially strong when control circuitry and power devices are used in the same semiconductor wafer or die. Control circuits are generally arranged to have all their device contacts on the top surface of the wafer or die where they may be readily interconnected. Power devices, on the other hand, often must utilize the entire thickness of the semiconductor die. This is especially true when very high voltage power devices are needed, when there must be a very high degree of isolation between the power devices and the control circuitry, or when large amounts of power must be handled. In this situation, one of the terminals of the power device must appear on the back or bottom surface of the semiconductor die. Such devices are referred to as bottom-contact devices. As used herein, the words "bottom-contact" are intended to refer to devices or device regions having at least one contact on the rear or bottom face of the die or wafer. Bottom-contact devices will generally also have other contacts on the front or top face of the die or wafer. As used herein, the words "top" or "front face" of the die or wafer are intended to refer to the surface where contacts to the control circuitry are generally placed. As used herein, the words "control circuits" or "control circuitry" are intended to refer to all manner of digital or linear devices, or combinations of devices, which may be used in conjunction with power devices, and which are integrated within the same semiconductor die as the power device.

Prior art semiconductor device structures and methods have not provided convenient means for obtaining bottom-contact power devices and top-contact control circuitry in the same semiconductor die, with isolation therebetween. With the prior art, it has generally been necessary to use multiple masking steps involving etched grooves, buried layers, and/or deep side wall diffusions to create the isolation regions surrounding the areas in which the devices or circuits are to be constructed. These techniques are undesirably expensive and may limit the attainable device performance.

A further problem with prior art structures and methods is that the doping type, density, and gradient of the semiconductor regions used for constructing the power devices and those used for constructing the integrated control circuitry usually cannot be varied independently, or can only be varied with great difficulty or within narrow limits. For these reasons, prior art means and methods have limited the ability to independently optimize both the power devices and the integrated control circuitry in the same wafer or die.

Accordingly, it is an object of the present invention to provide an improved means and method for locating top-contact devices or circuits in the same semiconductor die or wafer as bottom-contact devices or circuits, and for providing isolation therebetween.

It is a further object of the present invention to provide improved means and methods for semiconductor wafers or die having regions, within the same die, for integrated top-contact control circuits which are separate and isolated from regions for bottom-contact power devices, and wherein the separate, isolated regions have independently determined doping type, conductivity, and gradients.

It is an additional object of the present invention to provide improved means and methods for accomplishing the foregoing objectives wherein epitaxial regions are provided for containing the integrated control circuits, for forming the isolation regions, and for containing portions of the bottom-contact power devices.

SUMMARY OF THE INVENTION

Attainment of the foregoing and other objects and advantages is achieved through the present invention where there is provided a method for manufacturing isolated device structures comprising: providing a semiconductor substrate of a first conductivity and type; coating the substrate with a first epitaxial layer of a second conductivity and type; forming pedestals in the first epitaxial layer of a first height less than the first thickness; forming on the first epitaxial layer a second epitaxial layer of a second thickness less than the first height, and of a third conductivity and type; forming on the second epitaxial layer a third epitaxial layer of a third thickness and of a fourth conductivity and type, and wherein the sum of the second thickness and the third thickness is at least equal to the first height; and removing any portions of the second and third epitaxial layers protruding above the pedestals. Isolation is achieved by making the second epitaxial layer of a different type than the first and third epitaxial layers. Optionally, the pedestals may be formed directly in the semiconductor substrate and the first epitaxially layer omitted.

There is further provided an improved isolated semiconductor structure comprising: a semiconductor substrate of a first type and conductivity; a first semiconductor layer of a first height and a second type and conductivity in contact with the substrate and having a first surface; a first U-shaped semiconductor region of a third type and conductivity and of a first thickness and first depth, less than the first height, in the first semiconductor layer and extending to the first surface; a second semiconductor region within the first U-shaped semiconductor region and extending to the first surface and of a fourth type and conductivity, and of a second thickness, such that the sum of the first and second thickness substantially equals the first depth; and wherein the third type is opposite to the second and fourth type.

DETAILED DESCRIPTION OF THE DRAWINGS

FIGS. 1A–E show, in simplified form, a cross-sectional view through a device prepared according to the means and method of the present invention, at various stages of manufacture. Semiconductor substrate 10 is, in a preferred embodiment, covered by epitaxial layer 11. Semiconductor substrate 10 has a first conductivity and type. Epitaxial layer 11 has a second conductivity and type, which may be the same or different than substrate 10. Epitaxial layer 11 has thickness 11c.

Figure 1A:
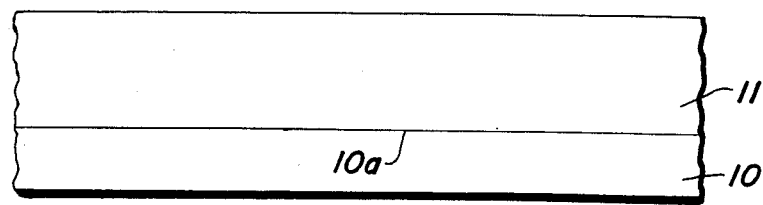
FIGS. 1A-E show, in simplified form, schematic cross-sections of a semiconductor device structure at different stages of manufacture, according to a first embodiment of the present invention.
Figure 1B:
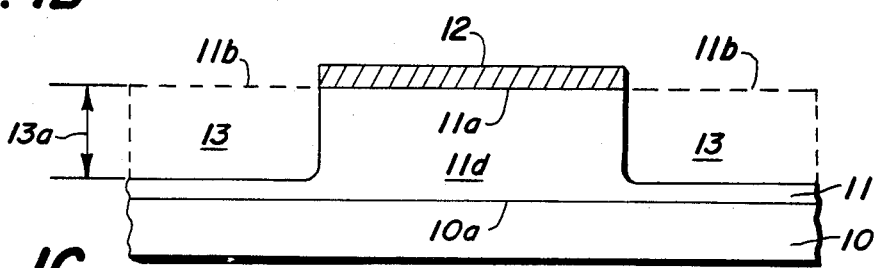
Figure 1C:
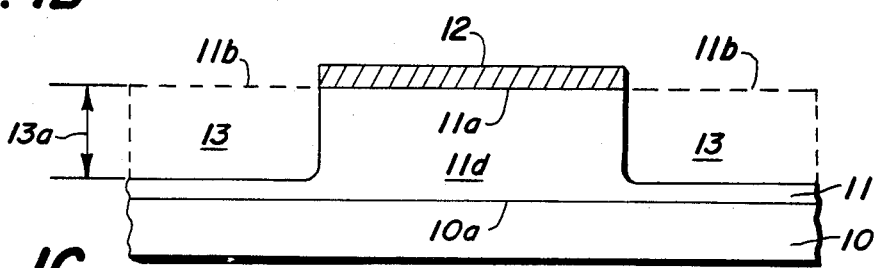

Surface 11a–b of layer 11 is covered by etch resistant masking layer 12 of thickness 12a which has been patterned, by means well known in the art, to provide covered surface portion 11a and exposed surface portions 11b on layer 11. Silicon dioxide is a useful material for masking layer 12. In FIG. 1C, exposed surface portions 11b of layer 11 are etched, using means well known in the art, to obtain recesses 13 of depth 13a in layer 11, and leaving behind pedestal 11d underneath covered surface portion 11a. The dotted line in FIGS. 1C–D outlines the portion of layer 11 that has been removed from exposed surface portions 11b. It is desirable that depth 13a be less than thickness 11c of layer 11. While it is desirable to utilize epitaxial layer 11, it is not mandatory. If layer 11 is omitted, then interface 10a between layer 11 and substrate 10 is absent. In this situation, the same sequence of steps is followed as illustrated in FIGS. 1A–E, 2A–C, and 3, but with layer 11 and its associated surfaces and pedestals treated as if they are part of substrate 10.

Figure 1D:
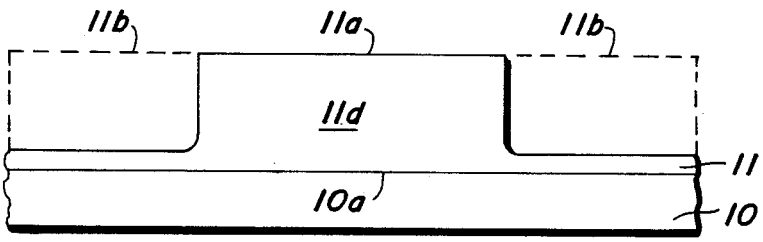
Figure 1E:
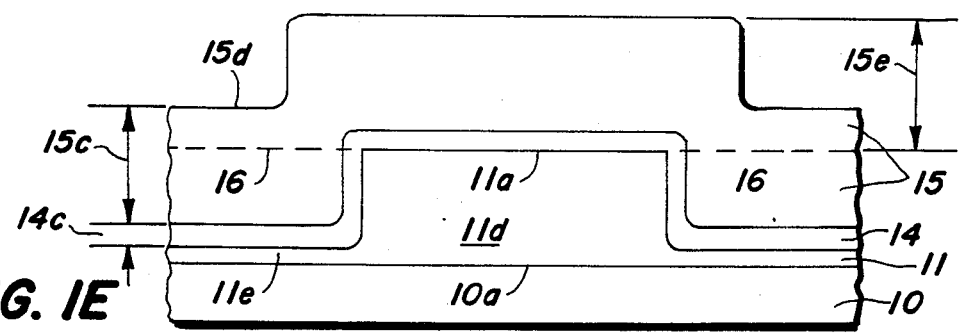
Figure 1C:
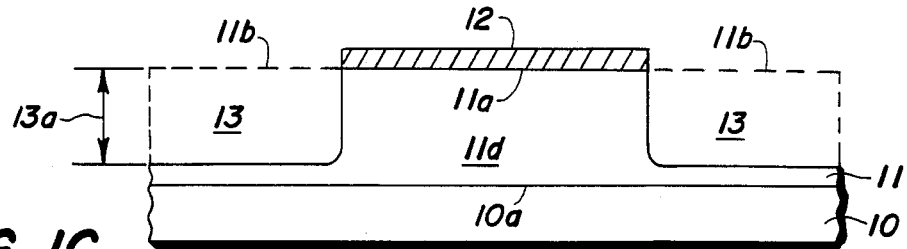

In a first embodiment of the method of the present invention, illustrated in FIGS. 1D–E, masking layer 12 is removed by means well known in the art, following which epitaxial layers 14 and 15 are formed one above the other on substrate 11. Layer 14 conformally coats layer 11, and has thickness 14c less than depth 13a. Layer 15 conformally coats layer 14 and has thickness 15c such that the sum of thickness 14c and thickness 15c equals or exceeds depth 13a. In this way, surface 15d of layer 15 lies even with or above the level, as shown by dotted line 16, of surface portion 11a of layer 11. Dotted line 16 is substantially coincident with the elevation of surface portion 11a of pedestal 11d.

Figure 3:
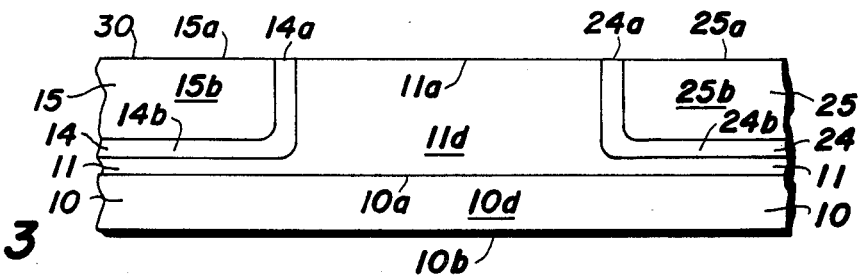
FIG. 3 shows, in simplified form, a schematic cross-section of a semiconductor device structure, according to the present invention, at a stage of manufacturing following the steps illustrated in FIGS. 1A–E or FIGS. 2A–C.

Using lapping, polishing, and/or etching techniques well known in the art, elevated portion or thickness 15e of layers 14 and 15, lying above dotted line 16, is removed to re-expose surface portion 11a of layer 11 and produce substantially the configuration shown in FIG. 3. The structure shown in FIG. 3 has substantially planar surface 30 composed of surface portion 11a on top of pedestal 11d of layer 11, portion 14a of layer 14, and portion 15a of layer 15.

Figure 4A:
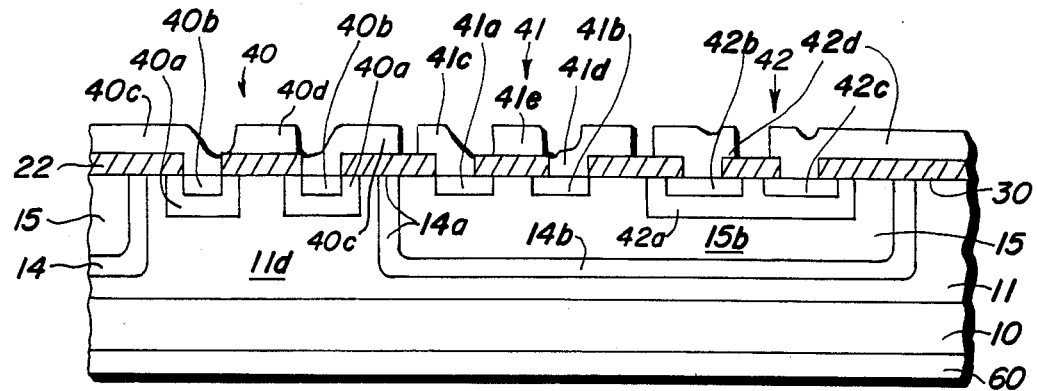
FIGS. 4A–C show, in simplified form, schematic cross-sections of several semiconductor device structures containing bottom-contact power devices and top-contact control devices, prepared according to the present invention.
Figure 4B:
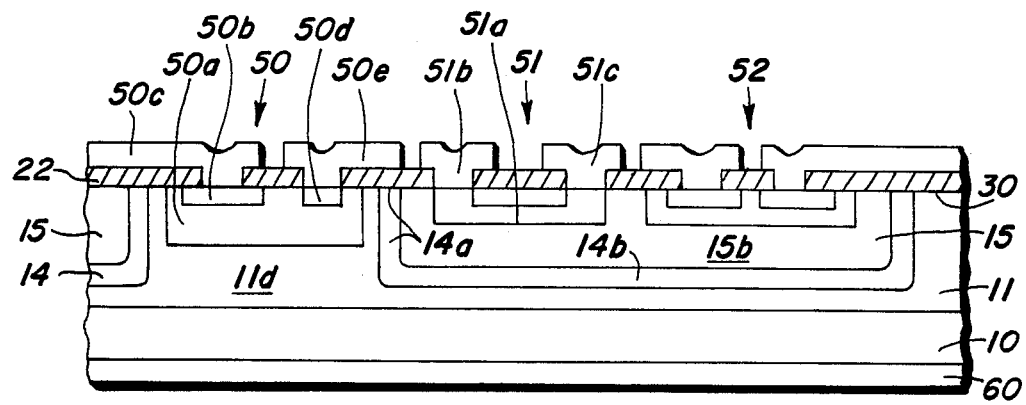
Figure 4C:
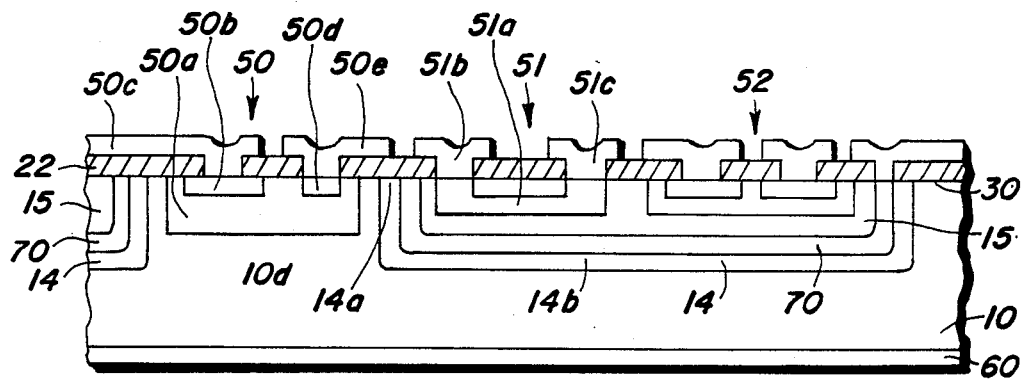

The structure of FIG. 3 has substantial advantages for the construction of bottom-collector devices and integrated, but isolated, control circuitry. Pedestal 11d provides a particularly convenient location in which a bottom-contact power device may be constructed. Surface portion 11a of pedestal 11d is a part of top surface 30. Pedestal 11d also communicates directly with substrate 10 at interface 10a and thus with bottom-contact surface 10b. In a typical n-type power transistor, substrate 10 forms the N+ collector or drain contact of the power transistor, and is accessible from bottom-contact surface 10b. Pedestal 11d in layer 11 is conveniently used as the drain region or collector region of the power device. For a 3-layer n-type device, layer 11 is conveniently formed from N− material. The source and gate regions of an MOS device or the emitter and base regions of a bipolar device are conveniently constructed in surface portion 11a of pedestal 11d, as is illustrated in FIGS. 4A–C. Layer 14 is usually highly doped p-type, and layer 15 is usually lightly doped n-type. P+ layer 14, comprising buried portion 14b and vertical portion 14a, isolates portion 15b of N layer 15 from pedestal 11d of N− layer 11.

The type and conductivity of layers 11, 14, and 15 in FIGS. 1A–E may be varied independently by changing epitaxial growth conditions. In this way, layer 14 can be made of opposite conductivity type to layers 11 and 15 so as to provide isolation therebetween. Further, layer 11 can have its type, conductivity, and doping gradient optimized for contruction of a bottom-contact power device in pedestal 11d, while layer 15 has its type, conductivity and doping gradient optimized for the construction of control circuitry in portion 15b. The means and method of the present invention allows the characteristics of the power device region (e.g. pedestal 11d), the isolation region (e.g. portions 14a–b), and the control circuitry region (e.g. region 15b) to be varied individually to accommodate conflicting device requirements. This is a substantial advantage over prior art approaches.

When the structure illustrated in FIG. 3 is formed with epitaxial layers, the doping range and gradients may be varied much more conveniently and in many situations over wider ranges than is possible with other fabrication techniques, such as diffusion and ion implantation. For example, in the prior art in which superimposed diffused regions are used, each successive diffused region must generally be doped to a level higher than the previous diffused region. Epitaxial layers are especially useful where the device regions must be thick in order to accommodate high voltages and/or provide a high degree of isolation. A further advantage of the present invention is that doping as a function of depth can be uniform. For example, vertical or wall portions 14a and buried portion 14b of layer 14 can both have the same dopant concentration and profile as a function of thickness, even though portion 14b is substantially parallel to the upper surface while portions 14a intersect the upper surface. This is not true with diffused isolation regions or layers, since the wall portions and buried portions are usually formed separately, and since the wall portions are generally diffused in from the surface and thus have higher dopant concentrations at the surface.

In the example of the power device which has been described above, when layer 11 is used, it is desirable that thickness 11c exceed depth 13a so that portion 11e of N− layer 11 remains between P+ isolation layer 14 and N+ substrate 10. This provides a higher breakdown voltage between substrate 10 and isolation layer 14.

It should also be noted that portion 14a of isolation layer 14 automatically appears at surface 30 so that a separate isolation wall diffusion or etch and refill step is not required. Thus, the present invention achieves isolation between regions 15b and 11d with fewer process steps than has been required in the prior art.

Figure 2A:
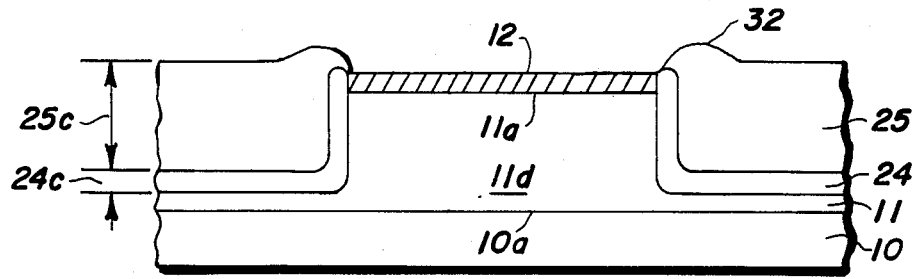
FIGS. 2A-C show, in simplified form, schematic cross-sections of a semiconductor device structure at different stages of manufacture, according to a further embodiment of the present invention.
Figure 2B:
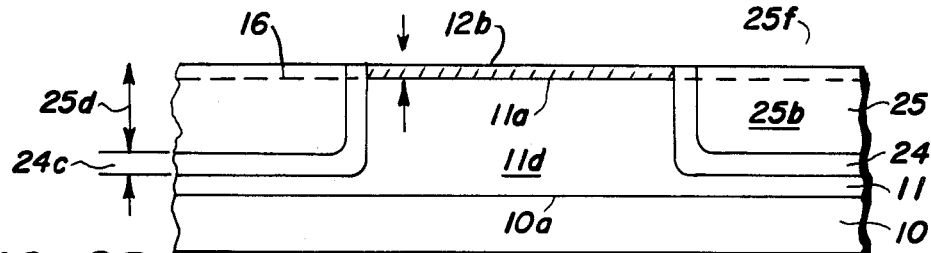
Figure 2C:
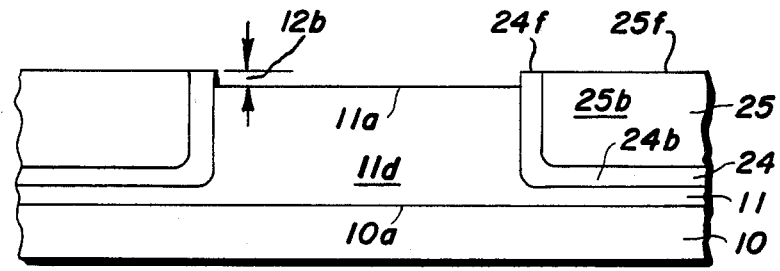

FIGS. 2A–C illustrate a further embodiment of the present invention for preparing the structure of FIG. 3. In this embodiment, after the steps shown in FIGS. 1A–C, layers 24 and 25 are deposited with mask layer 12 left in place (see FIG. 2A). Except for the difference in method of fabrication, layers 24 and 25 of FIGS. 2A–C and FIG. 3 correspond in function and properties to layers 14 and 15 of FIGS. 1A–E and FIG. 3. Where substrate 10 is silicon, it is convenient to form layers 11, 14, 15, 24, and 25 using chemical vapor deposition (CVD). CVD is a well known epitaxial deposition technique. Tri-chloro-silane and silicon-tetrachloride mixed with hydrogen as a carrier gas are commonly used as sources of silicon. If a small amount of HCL is mixed in the hydrogen, then the silicon will preferentially deposit on silicon and there will be little deposition on mask 12. This technique is well known in the art. The result of this process is illustrated schematically in FIG. 2A. The same considerations with respect to thickness 24c of layer 24 and thickness 25c of layer 25 relative to depth 13a of recess 13 apply as in the case of thicknesses 14c and 15c of layers 14 and 15.

Using lapping, polishing, and/or etching techniques well known in the art, protrusions 32 of layers 24 and 25 are removed to yield the structure illustrated in FIG. 2B. During this process, there will be some thinning of mask 12 so that remaining thickness 12b is less than initial thickness 12a. One advantage of the procedure illustrated in FIGS. 2A–C is that layer 12 will generally have different lapping and/or etching charcteristics than the adjacent semiconductor at 25f. Thus, mask 12 can be used as a polishing stop. A further advantage of retaining masking layer 12 is to prevent doping of surface 11a during deposition of layers 14 and 15.

Once protrusions 32 have been removed, as in FIG. 2B, remaining thickness 12b of mask 12 can be removed by etching, as shown in FIG. 2C. Thickness 12b is usually small compared to depth 13. The small difference in elevation between surface portion 11a and adjacent regions 24f and 25f, corresponding to remaining mask thickness 12b, usually will not interfere with further device processing and the structure of FIG. 2C can be used to construct devices such as illustrated in FIGS. 4A–C. However, if further planarization is desired, the structure of FIG. 3 is obtained by a slight additional polishing.

FIGS. 4A–C illustrate the use of the structure of FIG. 2C or FIG. 3 to build control circuitry and bottom-contact devices in the same semiconductor substrate. FIG. 4A shows MOS power device 40 formed in pedestal 11d. Device 40 is a TMOS type device in which substrate 10 with electrode 60 serves as the drain region and contact. MOS device 40 has doped regions 40a in which the channels are formed, source regions 40b, source contacts 40c, and gate electrode 40d. Dielectric layer 22 is conventional. Devices 41 and 42 are representative of control circuitry formed in isolated regions 15b, and comprise source region 41a, source contact 41c, drain region 41b, drain contact 41d, gate electrode 41e, base region 42a, base contact 42c, emitter 42b and electrodes 42d. It will be recognized by those of skill in the art that devices 41 and 42 are merely representative of the many device arrangements which can be used for control circuitry in conjunction with bottom-contact power device 40, and that no particular arrangement is intended to be suggested.

FIGS. 4B–C illustrate an alternative arrangement in which pedestal 11d or 10d is used to fabricate bipolar power device 50, comprising base 50a, emitter 50b, base contact 50d, and electrodes 50c and 50e. Substrate 10 with electrode 60 serves as the collector and collector contact. Control circuitry comprising illustrative devices 51 and 52 is formed in isolated region 15d. Device 51, by way of example, is a buried resistor comprising resistor channel region 51a and contacts 51b–c. Device 52 of FIGS. 4B–C is similar to device 42 of FIG. 4A. As before, these control devices are merely representative of many possible control device arrangements. Electrode 60 provides electrical connection to the bottom contact of power devices 40 or 50. FIG. 4C illustrates the configuration obtained when epitaxial layer 11 is omitted and pedestal 10d (equivalent to 11d) is formed directly in substrate 10.

It should also be noted in FIGS. 4A–C that isolation layer 14 is U-shaped, comprising bottom or buried portion 14b which is substantially parallel to surface 30 and wall portions 14a which intersect surface 30. As has been previously pointed out, the doping of layer 14 is substantially the same on both both bottom portion 14b and wall portions 14a. While wall portions 14a are shown as being vertical, sloping wall portions may also be used. However, they take up additional space. Region 15b of layer 15 is formed within U-shaped isolation layer 14. Both region 15b and layer 14 extend to surface 30.

As is further illustrated in FIG. 4C, additional U-shaped epitaxial layer 70 may be added between layer 14 and layer 15. This may be desirable when, for example, a buried collector structure is needed in connection with the control circuitry formed in region 15b. Like layer 14, layer 70 has wall portions which appear at surface 30 so that contact to the layer 70 may be readily made.

Being able to independently vary and control the doping type, concentration, and gradient permits the construction of much higher voltage integrated bottom-contact power device—control circuitry structures. Heretofore these have been limited to operating voltage below 500 volts. With the present invention, integrated bottom-contact power device—control circuitry structure able to operate above 500 volts, particularly above 750 to 1000 volts, are practicable.

Thus, it is apparent that there is provided in accordance with this invention an improved means and method for locating top-contact control circuitry and bottom-contact power devices in the same semiconductor wafer or die with isolation therebetween. There is further achieved an improved means and method for varying independently the doping type, concentration, and gradient in the regions provided for control circuitry, power devices, and isolation so that each may be optimized independently. The above advantages are provided with the same or fewer masking steps as in the prior art, since only one masking operation is required to create the regions adapted for forming the control circuitry, the power devices, and the buried and wall portions of the isolation layer therebetween. Further, the various layers can be formed by epitaxial deposition in a single reactor, while with prior art methods, separate diffusion or doping systems would be required. The present invention is adapted to forming different types of bottom-contact power devices including, but not limited to, MOS transistors, MOS thrysistors, bipolar transistors, and two, three, four, or more layer devices.

Having thus described the invention, it will be apparent to those of skill in the art that various modifications can be made within the spirit and scope of the present invention. Accordingly, it is intended to encompass, within the claims which follow, all such modifications.

I claim:

1. A method for manufacturing isolated semiconductor device structures, comprising:
   providing a semiconductor substrate of a first conductivity and type;
   coating said substrate with a first epitaxial layer of a first predetermined thickness and of a second conductivity and type;
   applying to said first epitaxial layer an etch resistant mask having an open portion in which a first portion of said first epitaxial layer is exposed for etching, and a closed portion in which a second portion of said first epitaxial layer is protected from etching;
   etching said first portion of said first epitaxial layer a first depth less than said first thickness thereby creating pedestals corresponding to said second portion of said first epitaxial layer;
   removing said etch resistant mask;
   forming on said first epitaxial layer a second epitaxial layer of a second thickness and a third conductivity and type;
   forming on said second epitaxial layer a third epitaxial layer of a third thickness and a fourth conductivity and type, wherein the sum of said second thickness and said third thickness is at least equal to said first depth;
   removing any portions of said second and third epitaxial layers protruding above said pedestal; and
   forming said semiconductor device in said pedestal, wherein said first epitaxial layer of said pedestal is used as a current carrying electrode region of a bottom contact power device.

2. The method of claim 1 wherein said first forming step comprises forming said second epitaxial layer to a second thickness less than said first depth.

3. The method of claim 1 further comprising, prior to said first forming step, removing said closed portion of said mask.

4. A method for manufacturing a semiconductor device structure, comprising;
   providing a semiconductor substrate of first conductivity and type;
   forming a first epitaxial layer of a first thickness on said substrate and having a first conductivity and type;
   applying to said first epitaxial layer an etch resistant mask having an open portion in which a first portion of said first epitaxial layer is exposed for etching, and a closed portion in which a second portion of said first epitaxial layer is protected form etching;
   etching in said first epitaxial layer a recess of a first depth less than said first thickness;
   removing said etch resistant mask;
   conformally coating said recess with a second epitaxial layer having a second thickness less than said first depth, and of a third conductivity and type; and
   forming over said second epitaxial layer, a third epitaxial layer having a third thickness sufficient to at least fill said recess, and of a fourth conductivity and type.

5. A method for manufacturing isolated semiconductor device structures, comprising:
   providing a semiconductor substrate of a first conductivity and type;
   applying to said substrate an etch resistant mask having an open portion in which a first portion of said substrate is exposed for etching, and a closed portion in which a second portion of said substrate is protected form etching;
   etching said first portion of said substrate to a first depth thereby creating pedestals corresponding to said second portion of said substrate;
   removing said etch resistant mask;
   forming on said substrate a first epitaxial layer of a first thickness and a second conductivity and type;
   forming on said first epitaxial layer a second epitaxial layer of a second thickness and a third conductivity and type, wherein the sum of said first thickness and said second thickness is at least equal to said first depth;
   removing any portions of said first and second epitaxial layers protruding above said pedestal; and
   forming said semiconductor device in said pedestal, wherein said substrate of said pedestal is used as a current carrying electrode of a bottom contact power device.

6. The method of claim 5 wherein said first forming step comprises forming said first epitaxial layer to a first thickness less than said first depth.

7. The method of claim 5 further comprising, prior to said first forming step, removing said closed portion of said mask.

* * * * *